(12) United States Patent
Pamer et al.

(10) Patent No.: US 8,576,520 B2
(45) Date of Patent: Nov. 5, 2013

(54) METHOD FOR DETECTING ARCS IN PHOTOVOLTAIC SYSTEMS AND SUCH A PHOTOVOLTAIC SYSTEM

(75) Inventors: Andreas Pamer, Wallern (AT); Guenter Ritzberger, Ansfelden (AT); Friedrich Oberzaucher, Wels (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 13/389,360

(22) PCT Filed: Jun. 2, 2010

(86) PCT No.: PCT/AT2010/000194
§ 371 (c)(1),
(2), (4) Date: Feb. 7, 2012

(87) PCT Pub. No.: WO2011/017721
PCT Pub. Date: Feb. 17, 2011

(65) Prior Publication Data
US 2012/0134058 A1    May 31, 2012

(30) Foreign Application Priority Data

Aug. 14, 2009 (AT) .............................. A 1285/2009

(51) Int. Cl.
*H02H 3/00* (2006.01)
*H02H 3/10* (2006.01)

(52) U.S. Cl.
USPC ................. 361/5; 361/8; 361/10; 361/42

(58) Field of Classification Search
USPC ............................ 361/5, 8, 10, 42
See application file for complete search history.

(56) References Cited

U.S. PATENT DOCUMENTS

| | | | | |
|---|---|---|---|---|
| 4,481,378 A | * | 11/1984 | Lesk | 136/244 |
| 5,513,620 A | * | 5/1996 | Pyko et al. | 123/609 |
| 5,703,743 A | * | 12/1997 | Lee | 361/6 |
| 6,021,052 A | * | 2/2000 | Unger et al. | 363/26 |

(Continued)

FOREIGN PATENT DOCUMENTS

| DE | 196 33 527 | 2/1998 |
|---|---|---|
| DE | 10 2004 056 436 | 6/2006 |

(Continued)

OTHER PUBLICATIONS

International Search Report of PCT/AT2010/000194, Oct. 6, 2010.

(Continued)

*Primary Examiner* — Rexford N Barnie
*Assistant Examiner* — Zeev V Kitov
(74) *Attorney, Agent, or Firm* — Collard & Roe, P.C.

(57) ABSTRACT

The invention relates to a method for detecting arcs in a direct-current path of a photovoltaic system, wherein values of a current ($I_{DC}$) of the direct-current path are detected during a repeating time frame (7) and a mean value (8) is generated, and such a photovoltaic system. In order to reliably detect arcs by means of a component of the photovoltaic system, values of a voltage ($U_{DC}$) of the direct-current path are detected during the time frame (7) and a mean value (8, 8') is generated, and at least one detection signal (9) and at least one detection threshold (10) are continuously calculated based on the mean values (8, 8') for the current ($I_{DC}$) and the voltage ($U_{DC}$) by means of a calculation method.

11 Claims, 3 Drawing Sheets

(56) References Cited

U.S. PATENT DOCUMENTS

Figure 1:
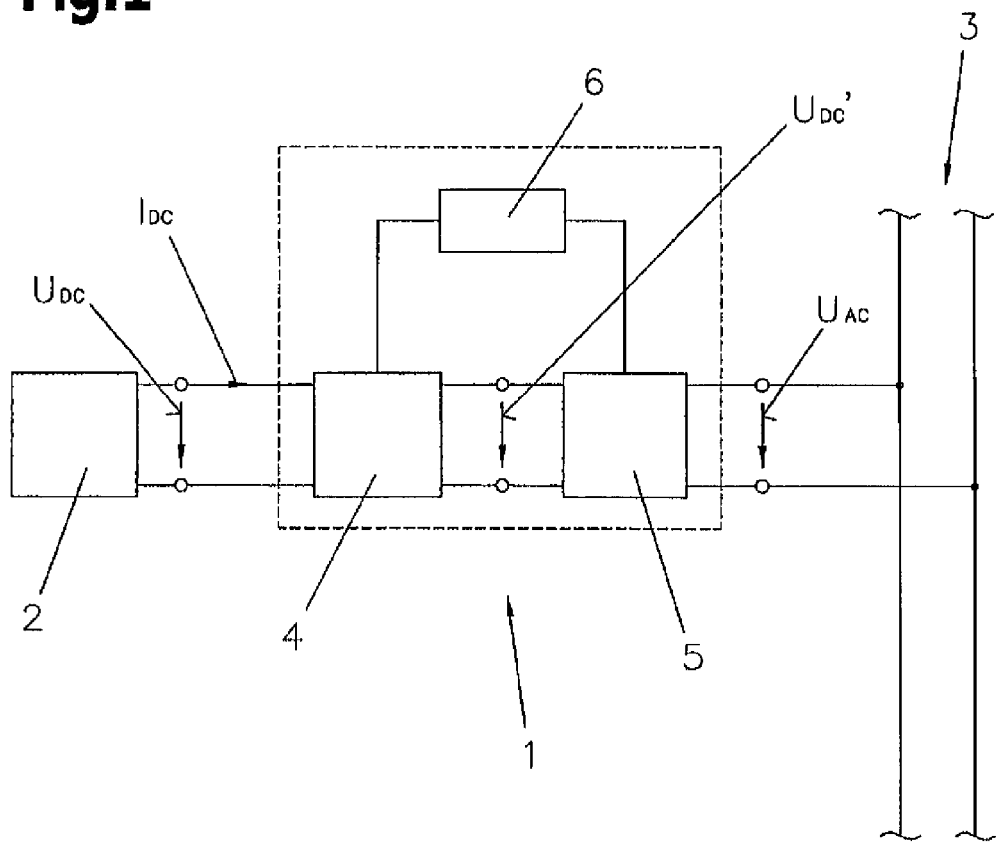

| | | | |
|---|---|---|---|
| 6,456,471 B1* | 9/2002 | Haun et al. | 361/42 |
| 7,219,023 B2 | 5/2007 | Banke et al. | |
| 7,463,465 B2* | 12/2008 | Rivers et al. | 361/42 |
| 7,812,592 B2 | 10/2010 | Prior et al. | |
| 2004/0150410 A1 | 8/2004 | Schoepf et al. | |
| 2006/0109009 A1* | 5/2006 | Banke et al. | 324/536 |
| 2010/0164459 A1 | 7/2010 | Perichon et al. | |

FOREIGN PATENT DOCUMENTS

| | | |
|---|---|---|
| EP | 1 796 238 | 6/2007 |
| EP | 1 918 727 | 5/2008 |
| FR | 2 912 848 | 8/2008 |
| WO | WO 95/25374 | 9/1995 |
| WO | WO 2011/011711 A2 | 1/2011 |

OTHER PUBLICATIONS

H. Haeberlin, Markus Real: "Arc Detector for Remote Detection of Dangerous Arcs on the DC Side of PV Plants", Conference Proceedings of $22^{nd}$ European Photovoltaic Solar Energy Conference, Milano, Italy, Sep. 2007, pp. 1-6, XP002600942, $22^{nd}$ European Photovoltaic Solar Energy Conference, Milano, Italy, p. 2, col. 1, line 4—p. 4, col. 1, line 17, figures 1, 4, 5. (ISR).

Japanese Office Action of JP 2012-524046 dated May 21, 2013 and English translation of same.

* cited by examiner

METHOD FOR DETECTING ARCS IN PHOTOVOLTAIC SYSTEMS AND SUCH A PHOTOVOLTAIC SYSTEM

CROSS REFERENCE TO RELATED APPLICATIONS

This application is the National Stage of PCT/AT2010/000194 filed on Jun. 2, 2010, which claims priority under 35 U.S.C. §119 of Austrian Application No. A 1285/2009 filed on Aug. 14, 2009, the disclosure of which is incorporated by reference. The international application under PCT article 21(2) was not published in English.

The invention relates to a method for detecting arcs in a direct-current path of a photovoltaic system, wherein values of a current of the direct-current path are detected during a repeating time frame and a mean value is generated.

The invention also relates to a photovoltaic system having components for feeding power into an AC voltage grid, having a DC-DC converter and a DC-AC converter for converting the DC voltage with associated direct current, generated by at least one solar cell, into an AC voltage for feeding into the AC voltage grid, and having a control device.

Direct-current arcs, such as series arcs or parallel arcs, often lead in photovoltaic systems to dangerous and costly fires, because the surrounding material is ignited in a very short time. Since direct-current arcs have no zero crossing, they are not automatically extinguished. It is therefore essential to detect arcs.

From WO 95/25374 A1 a detection method is known for series and parallel arcs. In this method, the detection unit is connected to the primary direct-current conductors of the photovoltaic system, so that voltage changes, and hence arcs, can be detected. The detection unit used is an analogue circuit and comprises in particular two inductively coupled resonant circuits, two comparators and a delay stage, so that a DC disconnector in the primary direct-current conductor can be activated and deactivated. A disadvantage of this method is that additional hardware components for the detection method must be incorporated into the photovoltaic system, which results in additional costs. A further disadvantage is that essentially no subsequent changes or modifications of parameters of the detection method are possible.

Another detection method for series and parallel arcs is known from EP 1 796 238 A2, which is carried out with a software module. To detect a series arc, the arithmetic mean is generated in time frames of the current waveform. If the difference in the mean values during two consecutive time frames exceeds a threshold value, a counter is incremented. If the difference remains below the threshold value, the counter is decremented. A series arc is then detected if the counter status exceeds a certain value. To detect a parallel arc, in a time frame a maximum and a minimum of the current waveform are determined and the difference thereof is calculated. If the difference is greater than a specific threshold value, a further counter is incremented. If the difference remains below the threshold value, this counter is decremented. A parallel arc is then detected if the counter status exceeds a certain value. A disadvantage of this method is that only the current waveform is taken into account. Also, an arc is detected only after multiple changes in current, so that damage can already have occurred. A further disadvantage is that different detection methods are used for series arcs and parallel arcs.

The object of the invention consists in creating an above cited method and an above cited photovoltaic system, with which the safety of the photovoltaic systems can be monitored using a component of the photovoltaic system. Disadvantages of known systems are to be avoided, or at least reduced.

The object of the invention is achieved according to the method by detecting values of a voltage of the direct-current path during the time frames and generating a mean value, and based on the mean values of the current and the voltage, by continuously calculating at least one detection signal and at least one detection threshold by means of a calculation method.

The object of the invention is also achieved by an above cited photovoltaic system, in which a measurement device for measuring the DC voltage and the DC current is provided, and the fact that the control device is designed for carrying out the above cited detection method.

An advantage relating to said solution and to the subsequent claims is that the detection is always carried out in relation to the output power of the inverter, since current and voltage are both detected. This means that the detection method can distinguish between arcs and changes in the incoming radiation. Therefore, arcs with smaller power levels are also detected, which leads to early detection of the arcs. A further advantage is that the sensitivity of the method can be adjusted via correction factors and can be carried out using a component of the photovoltaic system, for example the control device of the inverter. The method, which is advantageously implemented digitally, can therefore be implemented by means of a software update. A simple retrofit or integration into at least one existing component of the photovoltaic system is therefore obtained. It is additionally advantageous that the detection method can also be carried out at a low sampling rate (as low as the hundred-Hz range). This means that correspondingly fewer values need to be processed, so that the available resources can be used and hence component costs can be kept to a minimum.

Further advantages can be deduced from the description that follows.

The present invention is explained in further detail with the aid of the accompanying schematic drawings, wherein the disclosures contained in the entire description can be assumed to apply analogously to equivalent parts with the same reference labels. Furthermore, individual features from the exemplary embodiment or exemplary embodiments shown can per se represent independent solutions according to the invention.

Figure 7:
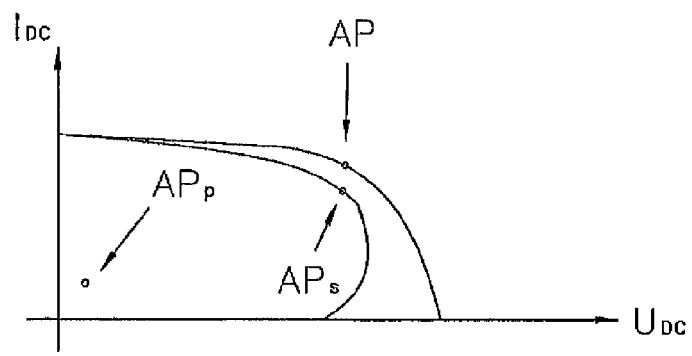
Figure 2:
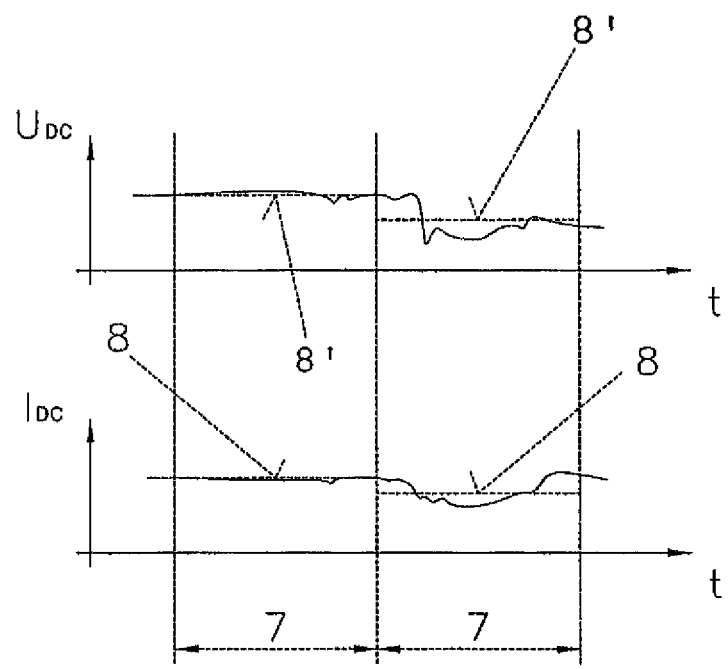
Figure 3:
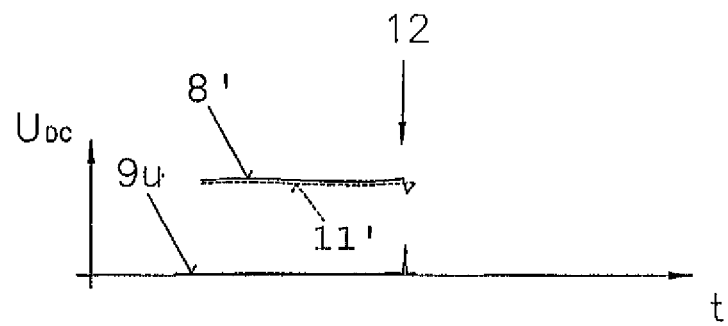
Figure 4:
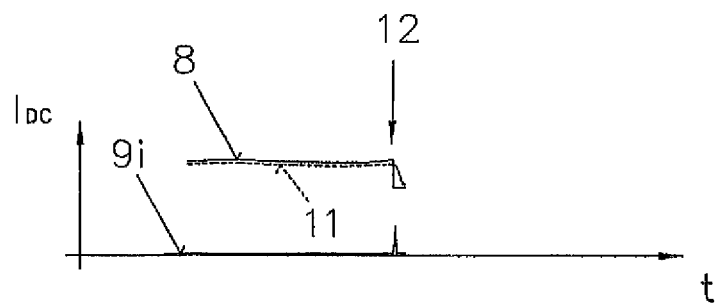
Figure 5:
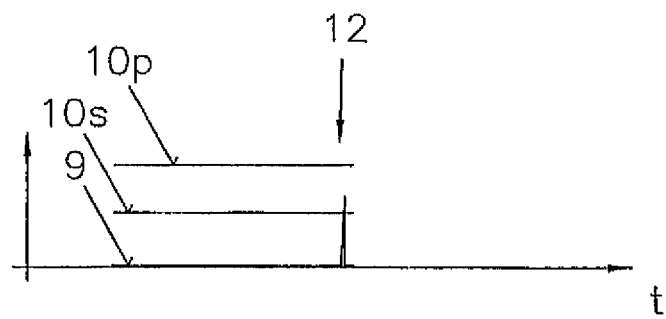
Figure 6:
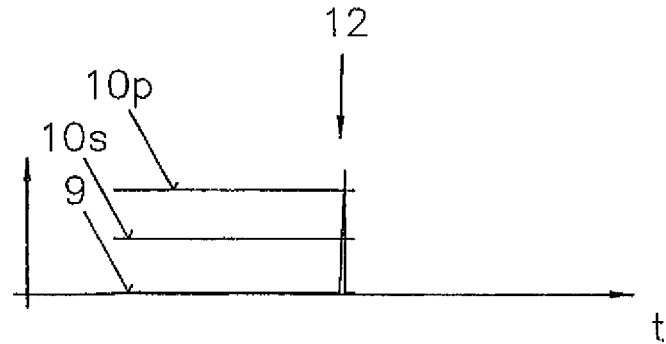

They show:

FIG. 1 a schematic block diagram of a photovoltaic system;

FIG. 2 schematic time courses of current and voltage of a photovoltaic system for determining the respective mean values;

FIG. 3 a schematic time courses of the mean value and the long-term mean value of the voltage until the occurrence of an arc, and the resulting detection signal;

FIG. 4 a schematic time course of the mean value and the long-term mean value of the current until the occurrence of an arc, and the resulting detection signal;

FIG. 5 a schematic view of a time course during the detection of a series arc;

FIG. 6 a schematic view of a time course during the detection of a parallel arc; and FIG. 7 a schematic view of the resulting operating points of the inverter of a photovoltaic system during an arc.

By way of introduction it is noted that equivalent parts of the exemplary embodiment are assigned identical reference labels.

Using FIGS. 1 to 7, a method for detecting arcs in a direct-current path of a photovoltaic system will be described.

FIG. 1 shows a block diagram of an inverter 1 of a photovoltaic system for supplying an input DC voltage $U_{DC}$ generated by at least one solar cell 2 with associated input DC current $I_{DC}$ into an AC voltage $U_{AC}$, which is fed into an AC voltage grid 3 or provided to a consumer. The photovoltaic system can comprise further components in addition to the inverter 1, such as a connection box and/or similar (not shown). The inverter 1 contains a DC-DC converter 4, which converts the input DC voltage $U_{DC}$ into a DC voltage $U_{DC}'$ suitable for the subsequent DC-AC-converter 5 of the inverter 1. By means of the DC-AC-converter 5 and a corresponding control device 6, the DC voltage $U_{DC}'$ is converted into the AC voltage $U_{AC}$. Accordingly, the direct-current path is situated between the solar cell 2 and the inverter 1 (shown by a dashed line). This essentially combines all parallel and serially connected solar cells 2 together into, for example, one connection box which is connected to the inverter 1. Consequently, the direct-current path comprises a plurality of conductors and contact points, wherein for the sake of clarity only one conductor is shown.

The contact points can be loosened, for example by temperature fluctuations, ageing, installation defects and/or poor screw connections or clamping, from which so-called series arcs occur. By contrast, parallel arcs primarily result from defects or damage to the insulation, when the conductors are guided near to one another. The arcs are created during the operation of the inverter 1 due to the current $I_{DC}$ flowing in the direct-current path and can cause dangerous fire outbreaks. In order to prevent this, methods for the detection of such arcs are used. In these, values of the current $I_{DC}$ of the direct-current path are detected during a repeating time frame 7 and a mean value 8, 8' is generated therefrom per time frame 7, as can be seen in FIG. 2. The latest mean value 8, 8' or the mean value 8, 8' of the last time frame 7 is then compared with the mean value 8, 8' of the preceding time frame 7. According to the invention it is then provided that during the time frame 7, values of the voltage $U_{DC}$ and the current $I_{DC}$ of the direct-current path are detected and in each case a mean value 8, 8' is generated, and based on the mean values 8, 8' for current $I_{DC}$ and voltage $U_{DC}$, a detection signal 9 and a detection threshold 10 are continuously calculated by means of a calculation method. By comparing the detection signal 9 with the detection threshold 10, a series and/or parallel arc is detected.

The basis of the detection method relies on the values of the voltage $U_{DC}$ and the current $I_{DC}$ of the direct-current path at the input of the component of the photovoltaic system—such as the inverter 1—that are continuously detected with a measurement device. These measured values are provided to the calculation method, which is carried out, for example, with the control device 6 of the inverter 1. In principle, the calculation of the Voltage $U_{DC}$ and the current $I_{DC}$ can be carried out in the same manner. Also essential to the detection method is the fact that a change in the incoming light radiation is not detected as an arc. An arc causes a one-off, rapid change in the current $I_{DC}$ and the voltage $U_{DC}$, whereas changes in the incoming radiation take place slowly and continuously by comparison.

The detection method is started after a starting process of the inverter 1, wherein the values of the detection method are preferably reset by the starting process. The measurement device delivers the continuously measured values which are split up by the calculation method into time frames 7 of equal size. In each time frame 7 the values for the current $I_{DC}$ and the voltage $U_{DC}$ are detected at a sampling frequency such that the time frames 7 have a defined period of, for example, 50 ms. After one time frame 7, the latest mean value 8 of the current $I_{DC}$ and the current mean value 8' of the voltage $U_{DC}$ are generated from the values captured in the time frame 7, as is shown in the diagrams in FIG. 2. By calculating the mean values 8, 8', sporadic changes are appropriately cancelled out. The mean values 8, 8' of the current $I_{DC}$ and the voltage $U_{DC}$ within the time frame 7 are drawn in with dashed lines. The temporal profile of these individual mean values 8, 8' is shown in FIGS. 3 and 4 using an example.

In the next step, from each of the latest mean values 8, 8' and the mean values 8, 8' of the preceding time frame 7, that is, from two consecutive mean values 8, 8', a difference mean value is calculated with the calculation method. Rapid changes between two time frames 7 can therefore be detected.

Also, the latest mean values 8, 8' are invoked for calculating the respective latest long-term mean values 11, which are continuously updated. The profile of the long-term mean values 11, 11' is also shown in FIGS. 3 and 4. The long-term mean value 11, 11' are calculated from the latest mean values 8, 8' by means of digital low-pass filtering, so that the influence of the latest mean value 8, 8' on the latest long-term mean value 11, 11' is small. With suitably chosen time constants and/or filter coefficients therefore, it can be guaranteed that arcs can be distinguished from changes in incoming radiation. Accordingly, the latest long-term mean value 11, 11' substantially only varies slowly in comparison to the rapid variation of the mean value 8, 8'.

By the same principle, the respective long-term mean values are calculated from the respective latest difference mean values by digital low-pass filtering with the same filter coefficients. Here also, the effect of the respective difference mean value is accordingly small. The long-term difference mean value therefore behaves like a delay element, so that this changes more slowly than the difference mean value. As a consequence, the long-term difference mean values serve as a measure of the strength of the incoming radiation, whereby arcs can be distinguished from changes in the incoming radiation.

By means of the difference mean values, the long-term mean values 11, 11' and the long-term difference mean values—which were calculated in a corresponding manner on the basis of the mean values 8, 8'—both the detection signal 9 and the detection threshold 10 can now be calculated.

To calculate the detection signal 9, a value for the voltage $U_{DC}$ is generated from the long-term difference mean value and the difference mean value—which corresponds to a detection signal $9u$ for the voltage $U_{DC}$—and multiplied by a value for the current $I_{DC}$—which corresponds to a detection signal $9i$ for the current $I_{DC}$—generated from the long-term difference mean value and the difference mean value. The values are therefore in each case the difference between the long-term difference mean value and the difference mean value, which were calculated at the same instant. A greater difference thus results for rapid changes in the voltage $U_{DC}$ or the current $I_{DC}$ respectively. This is because rapid changes have a much more marked effect in the difference mean value than in the long-term difference mean value. By this means it is also ensured that short, rapid changes are involved, as is the case when an arc is ignited. Should changes due to the incoming radiation level be involved, this has identical effects on the long-term mean value 11, 11' and the mean value 8, 8', since such changes take place over a longer period of time, so that the difference is essentially zero.

According to FIGS. 3 and 4 a rapid change is shown at time point 12 in terms of the mean values 8, 8' and long-term mean values 11, 11', which result in the corresponding detection signals $9u$ and $9i$. Similarly, slow changes result in no detection signal $9u$ or $9i$.

By multiplication of these two differences, or detection signals 9*u* and 9*i*, of current $I_{DC}$ and voltage $U_{DC}$ the change is correspondingly amplified, so that an arc is rapidly detected. The result of a calculation of this kind is that the detection signal 9 is essentially zero, as long as no rapid changes occur in the voltage $U_{DC}$ and the current $I_{DC}$ at the same time. This means therefore that for slow changes, the long-term difference mean value and the difference mean value behave in the same way, with the result that their difference, and similarly the detection signal 9, is zero. If however a fast, simultaneous change results due to an arc occurring, the detection signal 9 also changes significantly. The detection signal 9 therefore substantially reflects the change in power, which describes the loss of power due to the arc.

To calculate the detection threshold 10 on the other hand, the long-term mean values 11 of current $I_{DC}$ and voltage $U_{DC}$, calculated at the same time point, are multiplied. Therefore, the detection threshold 10 essentially corresponds to the latest power.

By means of such a calculation of the detection signal 9 and the detection threshold 10, these are always matched to the output power of the inverter 1, since these are continuously calculated based on the voltage $U_{DC}$ and the current $I_{DC}$.

In order that an arc can be detected at a later stage, the detection signal 9 must exceed the detection threshold 10, as is seen at time 12 according to FIGS. 5 and 6. In order to detect an arc, the change in power would have to exceed the latest power. Since this is not possible, a correction factor is used, at least to calculate the detection threshold 10 or the detection signal 9. Of course, a multiplicative correction factor can be used both for calculating the detection threshold 10 as well as for calculating the detection signal 9. In this case the correction factor for the detection signal 9 has a value greater than one and the correction factor for the detection threshold 10 a value less than one. It is guaranteed therefore, that arcs with low power—i.e. with a short arc length—can also be detected. Based on these calculations, the detection threshold 10 is adapted to slow changes in the current $I_{DC}$ and the voltage $U_{DC}$. Since the detection threshold 10 corresponds to the latest power and the power in turn depends on the strength of the incoming radiation, the detection threshold 10 is automatically adapted to the latest conditions. In addition, by means of the respective correction factors the sensitivity of the detection of arcs can be adapted, by the correction factor for the detection threshold 10 and the correction factor for the detection signal 9 being appropriately tuned to one another.

In principle a different correction factor is used for calculating the respective detection threshold 10 for a series arc and a parallel arc, so that a detection threshold 10*s* results for a series arc and a detection threshold 10*p* for a parallel arc. For detecting an arc, the common detection signal 9 is used. Therefore, firstly a common detection method can be used for both types of arc, and secondly, it is possible to detect the type of the arc occurring. This can be attributed to different behaviours of the photovoltaic system in the case of a series arc and a parallel arc, whereby the inverter 1 changes its operating point AP, as shown in FIG. 7.

If a series arc occurs in the photovoltaic system, the input DC voltage $U_{DC}$ is reduced due to the arc voltage drop, which causes the inverter 1 to change its operating point AP to an operating point APs due to the series arc. This also causes the output power to fall, it is true, but the operation of the rectifier 1 continues to be possible. In contrast to a small change in the operating point AP caused by a series arc, the operating point AP changes considerably in the event of a parallel arc. Since the parallel arc burns parallel to the input of the inverter 1 with a certain low arc voltage and has a low-valued resistance relative to the inverter resistance, only a very small part of the current $I_{DC}$ flows to the inverter 1. As a consequence the operating point AP changes markedly according to FIG. 7, so that an operating point $AP_p$ results due to the parallel arc. At such an operating point $AP_p$, effective operation of the inverter 1 is no longer possible.

The voltage change and current change are therefore much greater in the case of a parallel arc than of a series arc. Consequently the detection threshold 10*p* for a parallel arc is also higher than the detection threshold 10*s* for a series arc. If the detection signal 9 exceeds the detection threshold 10*s* for the series arc and not for the detection threshold 10*p* for the parallel arc according to FIG. 5, a series arc is detected. If both detection thresholds 10*s* and 10*p* are exceeded by the detection signal 9 according to FIG. 6 on the other hand, a parallel arc is detected. According to the calculation method, the detection signal 9 is generated on rapid changes of current and/or voltage or in the operating point AP, wherein essentially no detection signal 9 is generated for slow changes in the operating point AP due to changes in the strength of the incoming radiation.

After the detection signal 9 and the detection thresholds 10*s* and 10*p* have been calculated with the calculation method, according to the detection method the detection signal 9 and the detection thresholds 10*s*/10*p* are compared with one another. If the detection signal 9 exceeds at least one of the detection thresholds 10*s*/10*p*, an arc has occurred. That is, either a series arc or a parallel arc has been detected. Discrimination of the type of arc is necessary, since different measures are also necessary after one has been detected.

If the detection method is carried out in a component of the photovoltaic system other than the inverter 1 (as described), a corresponding communication of this other component to the inverter 1 takes place. The communication can take place, for example, by wireless means or over a wire link (dedicated bus system, modulated onto the direct-current path, etc.).

On detection of a series arc, the inverter is put into a safe condition, such that essentially alternating current is no longer generated. The current flow in the direct-current path is then interrupted and the arc is extinguished. If on the other hand a parallel arc is detected, the direct-current path is shorted by a switch. The arc voltage thereby becomes essentially zero, so that the arc is extinguished. Either the DC-DC-converter 4 or a dedicated switch, connected in parallel with the inverter 1, can be used as the switch.

The detection method described can also be combined with a frequency-selective analysis (e.g. by means of digital filters) and/or with an analysis in the frequency domain (e.g. Fast Fourier Transformation). If this is the case, due to the size of the spectral components in the waveform of the voltage $U_{DC}$ and/or the current $I_{DC}$, an additional detection signal 9 and an additional detection threshold 10 are generated, which can be appropriately combined with the results of the calculation method. The reliability is therefore further increased.

An alarm signal can also be generated, which is broadcast over the internet, by mobile radio or the like.

If no arc is detected, i.e. if the detection signal 9 remains below the detection threshold 10, the detection method continues. In general the detection method is carried out during the operation of the inverter 1. The detection method is started after a starting process of the inverter 1, so that stable values are available at the input of the inverter 1.

At defined intervals a test run of the detection method can also be carried out. This checks the functioning of the detection method. This can be performed, for example, directly by the inverter 1 or by an external device, and takes place in a resting state of the photovoltaic system. The test run is performed, for example, such that voltage and/or current signals which are changing at different rates, generated for example by a pulse generator, signal generator or similar device, are applied at the input of the inverter 1. Also, these voltage and/or current signals can also be simulated by particular values. These values are used, according to the detection method, instead of the continuously measured values of current $I_{DC}$ and voltage $U_{DC}$. The amplitudes of these signals are appropriately matched to the output power of the inverter 1. The waveforms are varied with an appropriate frequency, so that both slow as well as rapid changes can be simulated. Accordingly, at low frequencies of the waveforms no arc must be detected—since this corresponds to a change in the strength of the incoming radiation, wherein at higher frequencies an arc should be detected. By suitable choice of the amplitude it can also be investigated whether the detection method can distinguish between series arcs and parallel arcs.

The invention claimed is:

1. A method for detecting arcs in a direct-current path of a photovoltaic system, comprising the following steps:
   detecting values of a current ($I_{DC}$) of the direct-current path during a repeating time frame;
   generating a mean value of the current ($I_{DC}$);
   detecting values of a voltage ($U_{DC}$) of the direct-current path during the time frame (t);
   generating a mean value of the voltage ($U_{DC}$); and
   continuously calculating at least one detection signal and at least one detection threshold based on the mean value of the current and mean value of the voltage by means of a calculation method,
   wherein the detection signal and the detection threshold are calculated by means of calculating a difference mean value, a long-term mean value and a long-term difference mean value of each of the current and the voltage by digital low-pass filtering, and
   wherein a value is generated from the long-term difference mean value and the difference mean value of the voltage, and multiplied by a value generated from the long-term difference mean value and the difference mean value of the current to generate the detection signal.

2. The method according to claim 1, wherein the values of the detection signal are multiplied by a correction factor greater than 1.

3. The method according to claim 1, wherein the long-term mean values of the current and the voltage are multiplied to generate the detection threshold.

4. The method according to claim 1, wherein the detection threshold (10) is multiplied by a correction factor less than 1 for detecting a series arc.

5. The method according to claim 1, wherein the detection threshold is multiplied by a correction factor less than 1 for detecting a parallel arc.

6. The method according to claim 1, wherein an arc is detected when the detection threshold is exceeded by the detection signal, and a distinction is made between a series arc and a parallel arc.

7. The method according to claim 6, wherein after detection of an arc, said arc is extinguished.

8. The method according to claim 7, wherein to extinguish the parallel arc the direct-current path is short-circuited with a switch, and to extinguish the series arc the current flow in the direct-current path is interrupted.

9. The method according to claim 1, wherein the functioning of the detection method is checked with a test run.

10. The method according to claim 1, wherein the detection method is activated after a starting process of the photovoltaic system.

11. A photovoltaic system comprising:
    components for feeding power into an AC voltage grid;
    a DC-DC-converter;
    a DC-AC-converter for converting the DC voltage ($U_{DC}$) with associated direct current ($I_{DC}$) generated by at least one solar cell into an AC voltage ($U_{AC}$) for feeding into the AC voltage grid;
    a measurement device for measuring the DC voltage ($U_{DC}$) and the direct current ($I_{DC}$), and
    a control device designed for carrying out the method for detecting arcs in a direct-current path of the photovoltaic system according to claim 1.

* * * * *